(12) United States Patent
Sugioka

(10) Patent No.: US 7,781,820 B2
(45) Date of Patent: Aug. 24, 2010

(54) SEMICONDUCTOR MEMORY DEVICE AND METHOD OF MANUFACTURING THE SAME

(75) Inventor: Shigeru Sugioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 191 days.

(21) Appl. No.: 12/017,970

(22) Filed: Jan. 22, 2008

(65) Prior Publication Data

US 2008/0179652 A1 Jul. 31, 2008

(30) Foreign Application Priority Data

Jan. 31, 2007 (JP) ............................... 2007-022399

(51) Int. Cl.
*H01L 21/8242* (2006.01)
*H01L 27/108* (2006.01)

(52) U.S. Cl. ........................ 257/308; 257/301; 257/303; 257/306; 257/310; 257/E21.013; 257/E21.018; 257/E21.019; 257/E21.021; 257/E27.092; 257/E29.346; 438/243; 438/250; 438/253; 438/255; 438/256

(58) Field of Classification Search ................. 257/301, 257/303, 306, 308, 310, E21.013, E21.018, 257/E21.019, E21.021, E27.092, E29.346; 438/243, 250, 253, 255, 256
See application file for complete search history.

(56) References Cited

U.S. PATENT DOCUMENTS

| 7,074,669 | B2 * | 7/2006 | Iijima et al. | ................. | 438/253 |
| 2001/0026482 | A1 * | 10/2001 | Sakai | ........................ | 365/200 |
| 2004/0061167 | A1 * | 4/2004 | Mantha | ....................... | 257/315 |
| 2007/0042574 | A1 * | 2/2007 | Komatsu et al. | ............ | 438/482 |

FOREIGN PATENT DOCUMENTS

| JP | 11-087265 A | 3/1999 |
| JP | 2001-156024 A | 6/2001 |
| JP | 2003-347430 A | 12/2003 |
| JP | 2004-247441 A | 9/2004 |

* cited by examiner

*Primary Examiner*—Dao H Nguyen
(74) *Attorney, Agent, or Firm*—Sughrue Mion, PLLC

(57) ABSTRACT

The semiconductor memory device includes: an interlayer insulating film that is formed on a semiconductor substrate; an insulating film that is formed on the interlayer insulating film and has a cylinder hole; and a capacitor that has an impurity-containing silicon film, a lower metal electrode, a capacitive insulating film and an upper electrode, which are formed so as to cover a bottom and a side of the cylinder hole, wherein the cylinder hole extends through the insulating film so as to expose an end side of the contact plug, the end side facing opposite from the source electrode; and the impurity-containing silicon film has a silicide layer near an interface between the impurity-containing silicon film and the lower metal electrode, the silicide layer being produced by a reaction of impurity-containing silicon included in the impurity-containing silicon film with metal included in the lower metal electrode.

10 Claims, 9 Drawing Sheets

SEMICONDUCTOR MEMORY DEVICE AND METHOD OF MANUFACTURING THE SAME

BACKGROUND OF THE INVENTION

Priority is claimed on Japanese Patent Application No. 2007-22399, filed Jan. 31, 2007, the contents of which are incorporated herein by reference.

FIELD OF THE INVENTION

This invention relates to a semiconductor memory device having a capacitor stacked, in the form of a cylinder, on a semiconductor substrate, which is called a stacked capacitor, for use in, for example, a dynamic random access memory (DRAM), and a method of manufacturing the same.

DESCRIPTION OF THE RELATED ART

As a memory cell used in a DRAM (Dynamic Random Access Memory) has become smaller with miniaturization of a semiconductor device, it has become difficult to secure sufficient capacitance. However, a certain level of capacitance is required to secure stable operation and reliability of the DRAM. Accordingly, in order to secure a surface area, which is one of the factors to define capacitance, efforts have been made to increase capacitance by using a three-dimensional structural capacitor such as a stacked capacitor formed above the substrate, a trenched capacitor which is deeply embedded into a substrate, and the like. Although a method of forming several HSG-Si (Hemi Spherical Grain Silicon) layers on a silicon film of a lower electrode has been in wide use up to now in order to increase capacitance, there is now a capacitor having a MIM (Metal-Insulator-Metal) structure using a metal material, such as TiN, for the lower electrode in order to avoid capacitance loss due to depletion of the lower electrode (see Japanese Unexamined Patent Application, First Publication No. 2004-247441).

An example of a method of manufacturing a conventional semiconductor memory device having a MIM structural capacitor will be now described with reference to FIGS. 14 to 17.

As shown in FIG. 14, device isolation regions 102 are first formed on a semiconductor substrate 101, and then a well-forming and channel-doping process is performed to a transistor formation region partitioned by the device isolation regions 102 (not shown). In addition, in the transistor formation region a transistor is formed which includes: a gate insulating film 103; a gate electrode 106 including a silicon film 104 and a metal film 105 made of metal film 105 of W or the like; and a transistor including a source electrode 107 and a drain electrode 108 each of which includes an n type diffusing layer.

Next, a first interlayer insulating film 109 including a laminate including: a BPSG (Boro Phospho Silicate Glass) film; and a TEOS (Tetra Ethyl Ortho Silicate)—NSG (Non-doped Silicate Glass) film is formed on the entire surface of the semiconductor substrate 101, and an open-ended cell contact hole 110 is formed so as to extend through the first interlayer insulating film 109 and reach the source electrode 107 and the drain electrode 108 including n type diffusing layers on the semiconductor 101.

Next, a polycrystalline silicon film containing impurities such as phosphorus or the like is deposited on the first interlayer insulating film 109 while filling the cell contact hole 110. Thereafter, a cell contact plug 111 is formed by removing the impurity-containing polycrystalline silicon film on the first interlayer insulating film 109 using a dry etching technique and a chemical mechanical polishing (CMP) technique.

Next, a second interlayer insulating film 112 including a silicon oxide film is formed on the entire surface of the semiconductor substrate 101 on which the cell contact plug 111 is formed.

Then, a gate contact hole (not shown) is formed so as to extend through the second interlayer insulating film 112 and the first interlayer insulating film 109 and reach the gate electrode 106 using a photolithography technique and a dry etching technique. The gate contact plug to apply a potential to the gate electrode is formed in the gate contact hole.

In addition, a bit contact hole 113 reaching the top of the cell contact plug 111 is formed so as to extend through the second interlayer insulating film 112.

In addition, in the gate contact forming process and the bit contact forming process, the gate contact hole reaching a gate electrode of a transistor for a peripheral circuit through the second interlayer insulating film 112 and the first interlayer insulating film 109 and the bit contact hole reaching a diffusing layer (source electrode and drain electrode) of the transistor for a peripheral circuit region (not shown) through these films 109 and 112 are simultaneously formed in the peripheral circuit region.

In addition, a bit contact plug 114 and a gate contact plug (not shown) are formed by filling the bit contact hole 113 and the gate contact hole with a conductive material, and then, a bit line 115 electrically connected to the contact plug 114 is formed.

Next, a third interlayer insulating film 116 including a silicon oxide film is formed on the second interlayer insulating film 112, the bit contact plug 114 and the bit line 115 by a plasma CVD method, and is then planarized by a CMP technique. In addition, a capacitive contact hole 117 reaching the cell contact plug 111 through the third interlayer insulating film 116 and the second interlayer film 112 by a photolithography technique and an etching technique is formed. A capacitive contact plug 119 connecting the cell contact plug 111 to a deep hole cylinder 118, which will be described later, is formed in the capacitive contact hole 117.

In addition, the capacitive contact plug 119 is formed by filling the capacitive contact hole 117 with impurity-containing polycrystalline silicon in the same way as the cell contact plug 111.

Next, as shown in FIG. 15, an etching stopper plug 120, a silicon oxide film 121, which becomes a cylinder core, are sequentially formed on the third interlayer insulating film 116 and the capacitive contact plug 119, to form a fourth interlayer insulating film 122. In addition, a capacitor deep hole cylinder 118 reaching the capacitive contact plug 119 through the fourth interlayer insulating film 122 is formed by a photolithography technique and an anisotropy etching method.

Next, as shown in FIG. 16, after performing a wet pre-treatment to suppress resistance at an interface with the capacitive contact plug 119, a metal film to be a lower electrode 123 of a MIM capacitor is deposited by a CVD method, in the capacitor deep hole cylinder 118 and on the top of a partition wall of the cylinder 118. This metal film is, for example, a laminated layers of Ti and TiN. Since an underlying layer of the metal film contacts the capacitive contact plug 119 filled with the polycrystalline silicon film, the underlying layer is preferably made of a material lowering contact resistance.

Here, if a Ti film is formed as the underlying layer of the metal film, a silicide layer 119a produced by reaction of Si and Ti is formed on a surface exposed in the bottom of the capacitor deep hole cylinder 118 of the capacitive contact plug 119. The silicide layer 119a is a film having low resistance. Therefore the resistance between the lower electrode and the capacitive contact plug is reduced.

Thereafter, a positive type resist (not shown) is applied on the entire surface of the metal film. After a whole surface exposure, a development is conducted. As a result, only inside of the capacitor deep cylinder 118 remains unexposed, and the resist thereof remains intact. The metal film formed in the partition wall of the cylinder 118 is etched back by an anisotropy etching technique using the resist as a passivation film to protect the metal film in the capacitor deep hole cylinder 118. Accordingly, there remains only the metal film (lower electrode 123) in the capacitor deep hole cylinder 118. In addition, the resist remaining in the capacitor deep hole cylinder 118 is removed using plasma peeling and an organic peeling solution. Thus, the lower electrode 123 including the Ti film and the TiN film is formed.

In addition, on the lower electrode in the capacitor deep hole cylinder 118 are a capacitive insulating film 124 made of $Al_2O_3$ or the like is formed, and then, an upper electrode 125 made of TiN, and a capacitive plate 126 made of W or the like is formed, to complete a MIM capacitor having a cylinder structure (FIG. 17).

However, in a process of manufacturing a DRAM, as the capacitor deep hole cylinder 118 is formed with a high aspect ratio having a height of 3 μm, in order to ensure a sufficient level of capacitance while obtaining miniaturization thereof. Accordingly, the area of the bottom of the capacitor is small. In addition, with the miniaturization, the capacitive contact plug 119 connecting the capacitor to the cell contact plug is small and an area of contact between the bottom of the capacitor and the capacitive contact plug 119 is also very small. When the area of contact between the bottom of the capacitor and the capacitive contact plug 119 is small, if coating conditions of the metal used for the lower electrode 123 are poor, a film may not be adhered to the bottom of the capacitor deep hole cylinder 118, causing a possible poor formation of the silicide layer 119a. In this case, since resistance between the capacitor and the capacitive contact plug is increased, there is a possibility of lowering of yield.

SUMMARY OF THE INVENTION

The present invention has been made to overcome the above problems, and it is an object of the present invention to provide a semiconductor memory device and a method of manufacturing the same, which are capable of keeping a low electrical resistance between a capacitor and a capacitive contact plug irrespective of coating conditions of a metal film constituting a lower electrode, thereby attaining a high product yield.

(1) To accomplish the above object, the present invention provides a semiconductor memory device which includes: a semiconductor substrate; a transistor that is formed on the semiconductor substrate and has a source electrode; an interlayer insulating film that is formed on the semiconductor substrate; a contact plug that extends through the interlayer insulating film in a thickness direction and is connected to the source electrode of the transistor; an insulating film that is formed on the interlayer insulating film and has a cylinder hole; and a capacitor that has an impurity-containing silicon film, a lower metal electrode, a capacitive insulating film and an upper electrode, which are formed so as to cover a bottom and a side of the cylinder hole, wherein the cylinder hole extends through the insulating film so as to expose an end side of the contact plug, the end side facing opposite from the source electrode; and the impurity-containing silicon film has a silicide layer near an interface between the impurity-containing silicon film and the lower metal electrode, the silicide layer being produced by a reaction of impurity-containing silicon included in the impurity-containing silicon film with metal included in the lower metal electrode.

According to this configuration, even when coating conditions of the lower metal electrode are poor, a silicide layer having low electrical resistance is formed over a large area, because silicon included in the impurity-containing silicon film provided at the lower side of the lower metal electrode reacts with the metal included in the lower metal electrode. As a result, electrical resistance between the capacitor and the capacitive contact plug is decreased. Accordingly, it is possible to attain high product yield and provide a semiconductor memory device with high reliability.

In addition, because this silicide layer is formed, it is possible to maintain low-resistance between the capacitor and the capacitive contact plug even when an area of contact between the bottom of the capacitor and the capacitive contact plug becomes even smaller. Accordingly, it is possible to attain further miniaturization of a DRAM.

(2) In the semiconductor memory device of the present invention, the lower metal electrode may be a metal film that includes Ti.

According to this configuration, since the silicide layer can be reliably formed at least around the interface between the impurity-containing silicon film and the lower metal electrode, it is possible to reliably maintain low electrical resistance between the capacitor and the capacitive contact plug.

(3) In the semiconductor memory device of the present invention, the silicide layer may include $TiSi_2$.

According to this configuration, it is possible to reliably maintain low electrical resistance between the capacitor and the capacitive contact plug.

(4) In the semiconductor memory device of the present invention, the impurity-containing silicon film may be an impurity-containing polycrystalline silicon film.

According to this configuration, it is possible to obtain a capacitive contact plug having low electrical resistance.

(5) In addition, the present invention provides a method of manufacturing a semiconductor memory device, which includes the steps of: forming an interlayer insulating film on a semiconductor substrate on which a transistor is formed; forming a contact plug that extends through the interlayer insulating film in a thickness direction and reaches a source electrode of the transistor; forming an insulating film on the interlayer insulating film; forming a cylinder hole in the insulating film, the cylinder hole extending through the insulating film and exposing an end side of the contact plug, the end side facing opposite from the source electrode; forming an impurity-containing silicon film to cover a bottom and a side of the cylinder hole; and forming a lower metal electrode on the impurity-containing silicon film and producing a silicide layer near an interface between the impurity-containing silicon film and the lower metal electrode by reaction of impurity-containing silicon included in the impurity-containing silicon film with metal included in the lower metal electrode.

According to this method, even when coating conditions of the lower metal electrode are poor, the silicide layer having low electrical resistance is formed in a large area, since silicon contained in the impurity-containing silicon film formed in the lower side of the lower metal electrode reacts with the metal contained in the lower metal electrode. As a result, electrical resistance between the capacitor and the capacitive contact plug is decreased. Accordingly, it is possible to manufacture a semiconductor memory device with high reliability and high product yield.

(6) In the method of manufacturing a semiconductor memory device of the present invention, when the lower metal electrode is formed, a high temperature CVD method may be used for Ti and a thermal CVD method may be used for TiN.

According to this method, it is possible to produce the silicide layer sufficiently.

(7) In the method of manufacturing a semiconductor memory device of the present invention, the lower metal electrode may be formed under an atmosphere of 650° C. or above.

According to this method, it is possible to produce the silicide layer sufficiently.

DETAILED DESCRIPTION OF THE INVENTION

Hereinafter, a semiconductor memory device and a semiconductor memory device manufacturing method according to an embodiment of the present invention will be described.

Figure 1:
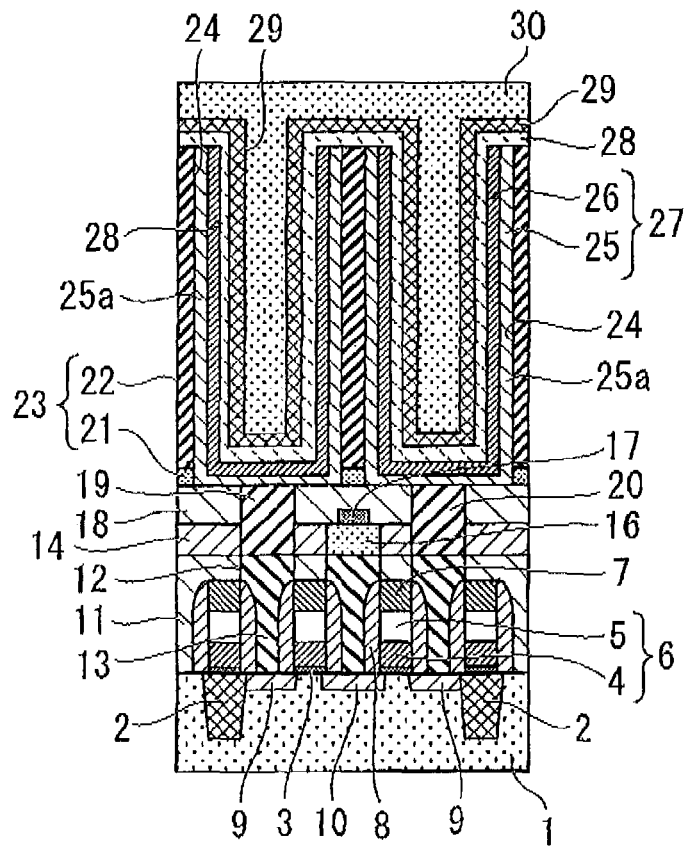
FIG. 1 is a cross-sectional view showing a semiconductor memory device according to a first embodiment of the present invention.

FIG. 1 is a cross-sectional view showing a semiconductor memory device according to an embodiment of the present invention. In this figure, a semiconductor substrate 1 is formed of a semiconductor, for example, silicon, containing impurities of a predetermined concentration.

Device isolation regions 2 isolating a transistor (selection transistor) are formed in regions other than transistor formation regions on the semiconductor substrate 1 by a STI (Shallow Trench Isolation) method.

In the transistor formation region, a gate insulating film 3 is formed as a silicon oxide film on the semiconductor substrate 1 by, for example, a thermal oxidation method or the like.

A gate oxide film 6 is formed by a multilayer laminate of a polycrystalline silicon film 4 and a metal film 5. For the polycrystalline silicon film 4, a doped polycrystalline silicon film with impurities doped therein when the film is formed in a CVD method may be used. For the metal film 5 a high melting point metal such as tungsten (W), tungsten silicide (WSi) or the like may be used.

An insulating film 7 such as a silicon nitride (SiN) or the like is formed on the gate electrode 6, that is, the metal film 5, and a side wall 8 such as an insulating film made of silicon nitride or the like is formed on a side wall of the gate electrode 6.

This embodiment addresses an exemplary structure in which the concept of the present invention is applied to a cell structure wherein a two-bit memory cell is arranged in one active region surrounded by the device isolation regions 2. In the active region surrounded by the device isolation regions 2 shown in FIG. 1, individual impurity diffusing layers are arranged in both ends and a central portion of the active region. This embodiment has a basic transistor structure in which: a drain electrode 10 is formed in the central portion; source electrodes 9 and 9 are formed in both ends, the gate insulating film 3 is formed in contact with the source electrodes 9 and the drain electrode 10; and the gate electrode 6 is formed further on the gate insulating film 3.

A first interlayer insulating film (interlayer insulating film) 11 is formed covering the entirety of the semiconductor substrate 1 and the insulating film 7. The first interlayer insulating film 11 includes a multilayer laminate of a BPSG film and a TEOS-NSG film.

The first interlayer insulating film 11 is provided with a cell contact hole 12 so as to expose the source electrode 9 and the drain electrode 10. The cell contact hole 12 is filled with a polycrystalline silicon film containing impurities of predetermined concentration, thereby forming a cell contact plug (contact plug) 13.

A second interlayer insulating film 14 is formed on the entirety the first interlayer insulating film 11 and the cell contact plug 13. The second interlayer insulating film (interlayer insulating film) 14 includes a silicon oxide film.

The second interlayer insulating film 14 is provided with a bit contact hole 15 which extends through the second interlayer insulating film 14 to expose an end side of the cell contact plug 13. The bit contact hole 15 is filled with a conductive material to form a bit contact plug 16.

A bit wiring layer 17 composed of a metal film such as a tungsten film or the like is formed on a surface of the bit contact plug 16. The bit wiring layer 17 is connected to a diffusing layer of the drain electrode via the bit contact plug 16 and the cell contact plug 13.

A third interlayer insulating film 18 is formed on the entirety of the second interlayer insulating film 14 and the bit wiring layer 17. The third interlayer insulating film 18 includes a silicon oxide film formed by a plasma CVD method.

The third interlayer insulating film 18 and the second interlayer insulating film 14 are provided with a capacitive contact hole 19 which extends through the second interlayer insulating film 14 so as to expose an end side of the cell contact plug 13. The capacitive contact hole 19 is filled with a polycrystalline silicon film containing impurities of predetermined concentration, thereby forming a capacitive contact plug (contact plug) 20.

A fourth interlayer insulating film (insulating film) 23 is formed on the third interlayer insulating film 18 and the capacitive contact plug 20. The fourth interlayer insulating film 23 includes a nitride film 21 and a silicon oxide film 22 which becomes a core of a cylinder. The nitride film 21 is used as an etching stopper when a capacitor deep hole cylinder 24 is formed.

The capacitor deep hole cylinder (cylinder hole) 24 is formed so as to extend through the fourth interlayer insulating film 23 at a position so as to expose the capacitive contact plug 20. A lower electrode 27 including: an impurity-containing silicon film 25; and a lower metal electrode 26, layered in this order, is provided in the bottom and the inner circumference surface of the capacitor deep hole cylinder 24.

The impurity containing silicon film 25 has a silicide layer 25a produced by reaction of metal and silicon contained in the lower metal electrode 26, at least around an interface between the impurity containing silicon film 25 and the lower metal electrode 26. The silicide layer 25a has a low resistance, resulting in a reduction of electrical resistance between the capacitor and the capacitive contact plug.

A capacitive insulating film 28 and an upper electrode 29 are layered in this order, on the lower electrode 27 and the fourth interlayer insulating film 23. In addition, the cylinder surrounded by the upper electrode 29 is filled with a capacitive plate 30, which is also laminated on the upper electrode 29 formed on the fourth interlayer insulating 23. That is, the capacitor as a capacitance storing unit 60 that stores data is formed by: the lower electrode 27; the capacitive insulating film 28; the upper electrode 29; and the capacitive plate 30.

In the semiconductor memory device as described above, even when the coating conditions of the lower metal electrode 26 are poor, since the silicide layer 25a having low electrical resistance is formed over a large area since silicon contained in the impurity-containing silicon film 25 formed in the lower side of the lower metal electrode 26 reacts with metal contained in the lower metal electrode, the electrical resistance between the capacitor and the capacitive contact plug is maintained low. Accordingly, it is possible to attain high product yield and high reliability.

Next, a semiconductor memory device manufacturing method according to the embodiment of the present invention will be described with reference to FIGS. 2 to 5. In the following description, a method of manufacturing a memory cell region of a DRAM will be described. A method of manufacturing a peripheral circuit region is the same as the method of manufacturing the memory cell region, and therefore, explanation will be omitted.

FIGS. 2 to 5 are vertical cross-sectional views illustrating a semiconductor memory device manufacturing method in a processing order according to an embodiment of the present invention.

Figure 2:
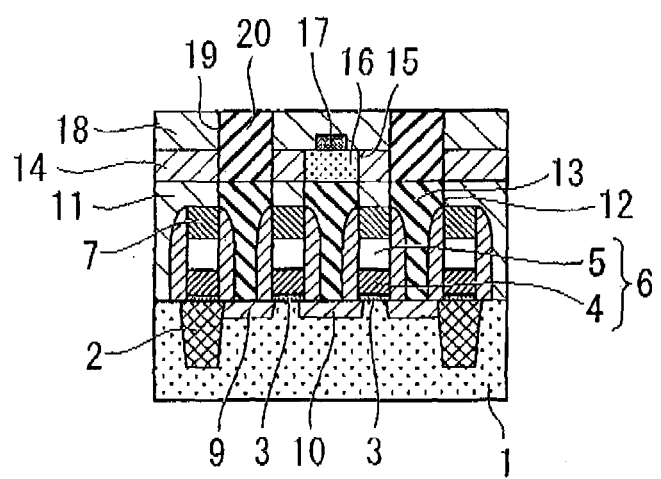
FIG. 2 is a cross-sectional view illustrating a semiconductor memory device manufacturing method in the processing order according to the first embodiment of the present invention, showing a state in which a cell contact plug and a capacitive plug are formed in addition to a transistor structure including source, drain and gate electrodes.

First, as shown in FIG. 2, device isolation regions 2 are formed on a semiconductor substrate 1. Then, a gate insulating film 3; a gate electrode 6 composed of a silicon film 4 and a metal film 5 made of W or the like; a transistor having a source electrode 9 and a drain electrode 10, which include an n type diffusing layer; an insulating film 7; and a side wall 8 are formed, in a transistor formation region partitioned by the device isolation regions 2.

Next, a BPSG film is formed at a thickness of 600 nm to 700 nm on the semiconductor substrate 1 and the transistor by a CVD method, and then a surface of the BPSG film is planarized by 800° C. reflow and a CMP technology. Then, a TEOS-NSG film is formed at a thickness of approximately 200 nm on the BPSG film to form a first interlayer insulating film 11 including the BPSG film and the TEOS-NSG film.

Next, the open-ended cell contact hole 12 is formed, reaching the source electrode 9 and the drain electrode 10 which include n type diffusing layer and provided on the semiconductor substrate 1, so as to extend through the first interlayer insulating film 11, using a photolithography technique and a dry etching technique with a photoresist film as a mask. Thereafter, the photoresist film is peeled off by a dry etching technique.

Next, a first silicon film, which includes polycrystalline silicon or amorphous silicon with added impurities such as phosphorus or the like, is charged in the cell contact hole 12, and is also deposited on the first interlayer insulating film 11. Then, a cell contact plug 13 is formed, by removing only the first silicon film on the first interlayer insulating film 11 by etch-back by chlorine-based plasma gas using a dry etching technique, and a CMP technique.

At this time, the impurity concentration of the first silicon film is set to be in a range of $1.0 \times 10^{20}$ to $4.5 \times 10^{20}$ atoms/cm$^3$. In addition, a distance between the top surface of the first interlayer insulating film 11, after removal of the first silicon film by the CMP technique, and the surface of the semiconductor substrate 1 becomes about 450 nm.

Next, a second interlayer insulating film 14 including a silicon oxide film is formed at a thickness of approximately 200 nm on the entire surface of the first interlayer insulating film 11 on which the cell contact plug 13 is formed.

Then, a gate contact hole (not shown) reaching the gate electrode 6 is formed so as to extend through the second interlayer insulating film 14 and the first interlayer insulating film 11, by a dry etching technique using a photoresist film as a mask. A gate contact plug to apply a electric potential to the gate electrode 6 is formed in the gate contact hole. Thereafter, the photoresist film is peeled off by a dry etching technique.

In addition, a bit contact hole 15 reaching the cell contact plug is formed so as to extend through the second interlayer insulating film 14 by a dry etching technique using a photoresist film as a mask. Thereafter, the photoresist film is peeled off by a dry etching technique.

In the gate contact forming process and the bit contact forming process: the gate contact hole reaching the gate electrode of the transistor for the peripheral circuit through the second interlayer insulating film 14 and the first interlayer insulating film 11; and the bit contact hole reaching the diffusing layer (source electrode and drain electrode) of the transistor for the peripheral circuit region (not shown) through these films 11 and 14, are simultaneously formed in the peripheral circuit region.

Next, Ti and TiN as barrier metals are sequentially formed at a thickness of 11 nm and 13 nm, respectively, in the bit contact hole 15, in the gate contact hole, and on the second interlayer insulating film 14, by a CVD technique. Then, the bit contact hole 15 is filled with tungsten, which is also formed at a thickness of approximately 200 nm, on a TiN film formed on the second interlayer insulating film 14. Then, a bit contact plug 16 is formed by removing Ti, TiN and tungsten outside the bit contact hole 15 by a CMP technique.

Next, a tungsten nitride film and a tungsten film are sequentially formed at a thickness of 10 nm and 40 nm, respectively, on the second interlayer insulating film 14, the bit contact plug 16 and the gate contact plug by a sputtering technique. Then, these films are patterned by a photolithography technique and a dry etching technique to form a bit line 17 electrically connected to the bit contact plug 16. Then, a silicon nitride film (not shown) which serves as an oxidation protection film of the bit line 17 is formed at a thickness of approximately 5 nm by a CVD technique.

Next, a silicon oxide film as a third interlayer insulating film 18 is formed at a thickness of 500 nm on the second interlayer insulating film 14, the bit contact plug 16 and the bit line 17, by a CVD technique. Then, a surface of the silicon oxide film is planarized by a CMP technique. A distance between the top of the planarized third interlayer insulating film 18 and the top of the bit line 17 is approximately 300 nm.

Next, a capacitive contact hole 19 reaching the cell contact plug 13 through the third interlayer insulating film 18 and the second interlayer insulating film 14 is formed on the third interlayer insulating film 18 by a photolithography technique and an etching technique. A capacitive contact plug 20 connecting the cell contact plug 13 to a capacitor deep hole cylinder 24 is formed in the capacitive contact hole 19.

Next, a second silicon film made of polycrystalline silicon or amorphous silicon with added impurities such as phosphorus or the like fills the capacitive contact hole 19 and is also deposited on the third interlayer insulating film 18. Then, a capacitive contact plug 20 is formed by removing only the second silicon film on the third interlayer insulating film 18 by etching-back with chlorine-based plasma gas using a dry etching technique, and a CMP technique.

At this time, the impurity concentration of the second silicon film is set to be $1.0 \times 10^{20}$ to $4.5 \times 10^{20}$ atoms/cm$^3$. In addition, since the third interlayer insulating film 18 is partially cut away when the second silicon film is removed, a distance between the top surface of the resultant third interlayer insulating film 18 and the top surface of the bit line 17 becomes approximately 200 nm.

Figure 3:
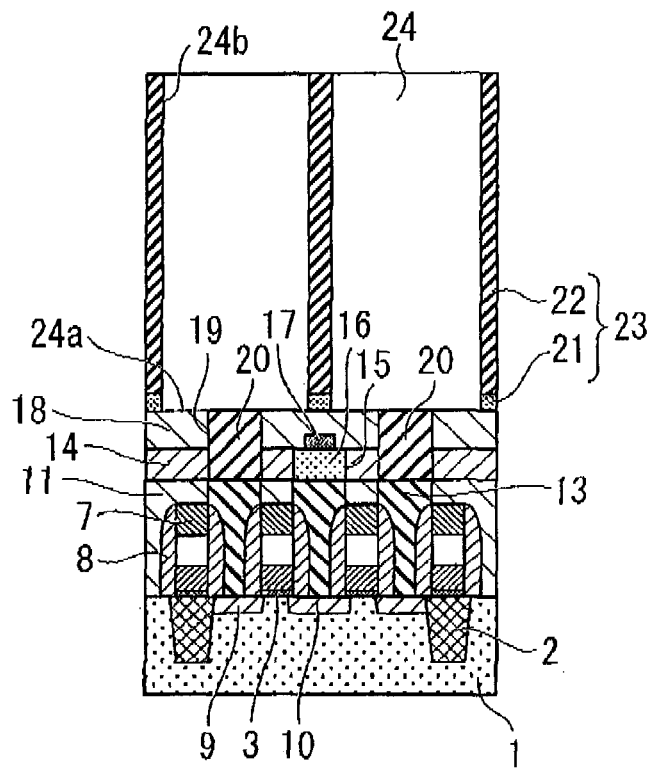
FIG. 3 is a cross-sectional view illustrating a semiconductor memory device manufacturing method in the processing order according to the first embodiment of the present invention, showing a state in which a capacitor deep hole cylinder is formed on an interlayer insulating film.

Next, an etching stopper nitride film 21 is formed on the third interlayer insulating film 18 and the capacitive contact plug 20; and then, a silicon oxide film 22 which becomes a cylinder core, is formed at a thickness of 3 μm on the etching stopper nitride film 21, to form a fourth interlayer insulating film 23. Then, as shown in FIG. 3, the capacitor deep hole cylinder 24 reaching the capacitive contact plug 20 through the fourth interlayer insulating film 23 is formed using a photolithography technique and an anisotropy etching technique.

Next, prior to the next process of forming a third silicon film 25, in order to suppress resistance at an interface with the capacitive contact plug 20, a naturally oxidized film attached to a surface of the second silicon film in the capacitive contact hole 19 is removed by performing a wet pre-treatment using a fluoric acid-containing solution.

Figure 4:
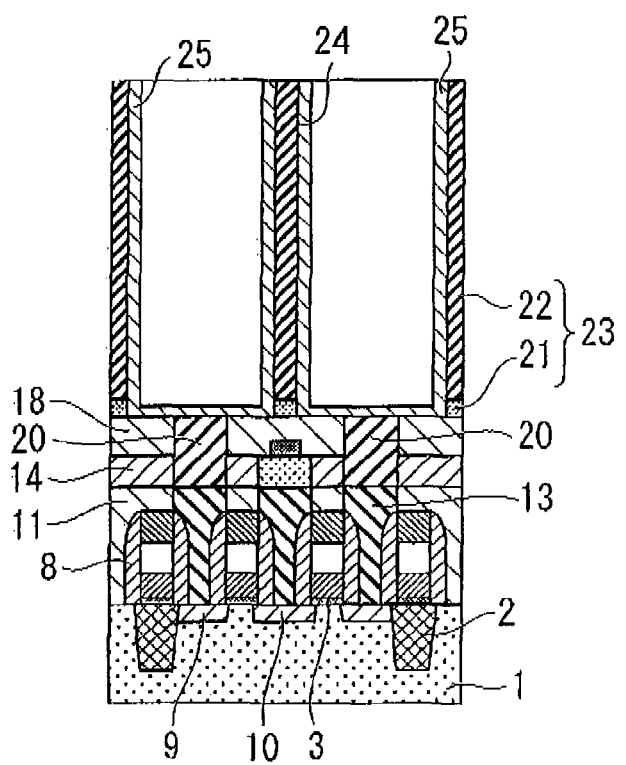
FIG. 4 is a cross-sectional view illustrating a semiconductor memory device manufacturing method in the processing order according to the first embodiment of the present invention, showing a state in which a silicon film is formed in the deep hole cylinder.

Next, as shown in FIG. 4, after the wet pre-treatment, the third silicon film 25 made of polycrystalline silicon or amorphous silicon with added impurities is formed at a thickness of 25 to 35 nm on the entire surface including the inner bottom 24a and the inner side 24b of the capacitor deep hole cylinder 24, and the top surface of a partition wall between cylinders 24, by a CVD method. The impurity concentration of the third silicon film 25 is, preferably, approximately $4.4 \times 10^{20}$ atoms/cm$^3$.

Next, a positive type resist is coated on the entire surface of the third silicon film 25 and is exposed and then developed. As a result, the resist remains without being exposed to light, only in the capacitor deep cylinder 24. Using the resist as a passivation film to protect the third silicon film 25 in the capacitor deep hole cylinder 24, the third silicon film 25 formed on the partition wall of the cylinder 24 is etched back by an anisotropy etching technique using Cl. Thus, only the third silicon film in the capacitor deep hole cylinder 24 remains intact. Then, the resist is removed using peeling (plasma peeling) by a dry etching technique and peeling by a wet treatment.

Figure 5:
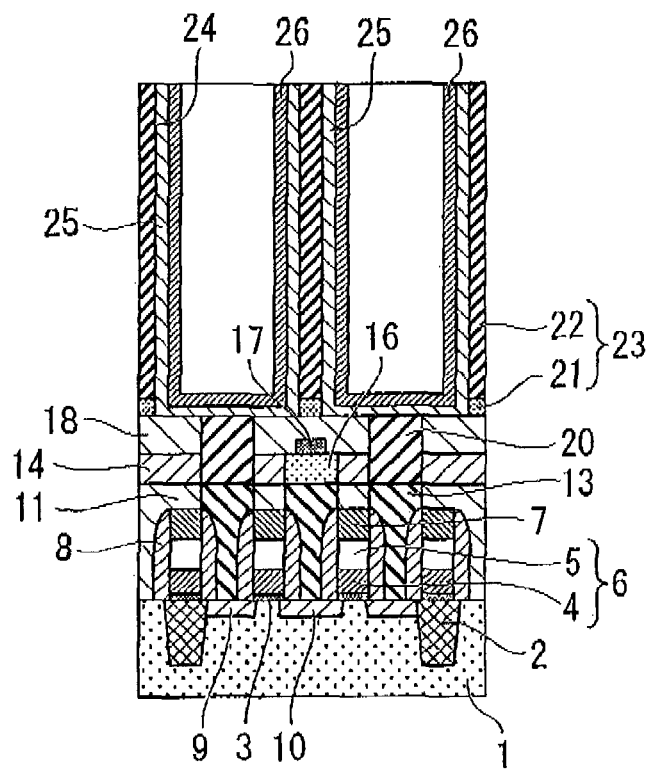
FIG. 5 is a cross-sectional view illustrating a semiconductor memory device manufacturing method in the processing order according to the first embodiment of the present invention, showing a state in which a lower metal electrode is formed in the deep hole cylinder.

Next, as shown in FIG. 5, a lower metal electrode 26 having an MIM structure is formed.

As the lower metal electrode 26, a multilayer laminated film is provided, which includes, for example, a Ti film and a TiN film stacked in this order using a high temperature plasma CVD technique and a thermal CVD technique, respectively. The thickness of the Ti film and the TiN film is approximately 10 nm and 20 nm, respectively. When the Ti film is formed at high temperature of 650° C., the Ti film is completely silicided in-situ, and thus, a film having low resistance, which is called silicide (TiSi$_2$), is formed at an interface between the third silicon film 25 and the lower metal electrode 26. Here, in this manufacturing method, even when coating conditions of the Ti film are poor, since the third silicon film 25 is formed in the inner bottom 24a and the inner side 24b of the capacitor deep hole cylinder 24, an area of contact between the Ti film and the silicon film is large and thus a silicide layer 25a is formed to have a large area. This prevents poor formation of the silicide layer 25a, thereby reducing resistance between the capacitor and the capacitive contact. The metal material, film thickness and formation method of the lower metal electrode 26 are not limited to those described above.

In order to attain a good contact characteristic in this invention, it is preferable that the third silicon film 25 be approximately 20 to 40 nm in thickness and particularly the Ti film of the lower metal electrode 26 be approximately 10 to 15 nm in thickness.

If the thickness of the third silicon film 25 excessively exceeds the upper limit of the above range, even though it is sufficient to form the silicide layer, it is not appropriate for the use in capacitor, because it causes a low capacity. If the thickness of the third silicon film 25 is less than 15 nm, the thickness of the formed silicide layer is insufficient, thereby deteriorating a contact characteristic. If the thickness of the Ti film of the lower metal electrode 26 exceeds 20 nm, it is not preferable because of excessive reaction of the silicide layer. If the thickness of the Ti film is less than 5 nm, the silicide layer is insufficiently formed, thereby increasing resistance between the capacitor and the capacitive contact.

After forming the lower metal electrode 26, the metal film (lower metal electrode 26) in the partition wall of the capacitor deep hole cylinder 24 is removed in the same way used for the third silicon film 25. Specifically, a positive type resist is once more coated on the entire surface and exposed and then developed. As a result, the resist remains without being exposed to light, only in the capacitor deep cylinder 24. Using the resist as a passivation film to protect the lower metal film 26 in the capacitor deep hole cylinder 24, the lower metal film 26 formed on the partition wall of the cylinder 24 is etched back by an anisotropy etching technique using Cl. Thus, only the lower metal film 26 in the capacitor deep hole cylinder 24 remains intact. Then, the resist is removed using peeling (plasma peeling) by a dry etching technique and an organic peeling solution.

Here, the above-described third silicon film 25 and lower metal electrode 26 are collectively referred to as a lower electrode 27.

Then, a high dielectric constant film made of $Al_2O_3$ or $HfO_2$, as a capacitive insulating film 28, is formed at a thickness of approximately several run on the lower electrode 27 in the capacitor deep hole cylinder 24. Then, a TiN film as an upper electrode 29 and a W film as a capacitive plate 30 are sequentially formed. Thus, a semiconductor memory device having a cylinder structure including the third silicon film 25 under an MIM structure is completed (FIG. 5). Alternatively, a different oxide film, such as a $Ta_2O_5$, a multilayer film of several oxide films, or the like may be used for the capacitive insulating film 28.

As described above, in this manufacturing method, even when the coating conditions of the lower metal electrode are poor, since the interface resistance between the capacitor and the capacitive contact plug is decreased, it is possible to attain a miniaturization of a DRAM, without considering an increase of the interface resistance, and also to attain a high product yield and high reliability.

In the above embodiment, the material, film thickness and formation method of parts of the semiconductor memory device are non-limitative and may be modified, as desired, without departing from the spirit and scope of the present invention.

Figure 6:
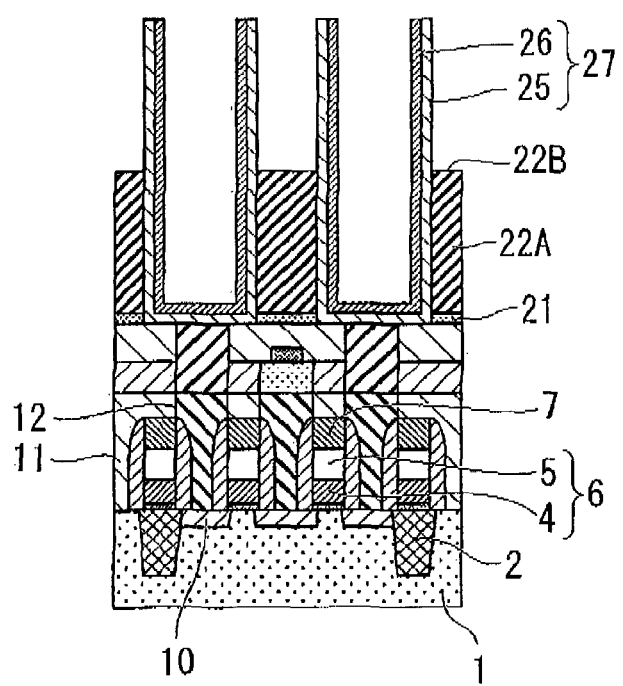
FIG. 6 is a cross-sectional view illustrating a semiconductor memory device manufacturing method according to a second embodiment of the present invention, showing a state in which a lower metal electrode and a third silicon film are formed and machined after a deep hole cylinder is machined.
Figure 7:
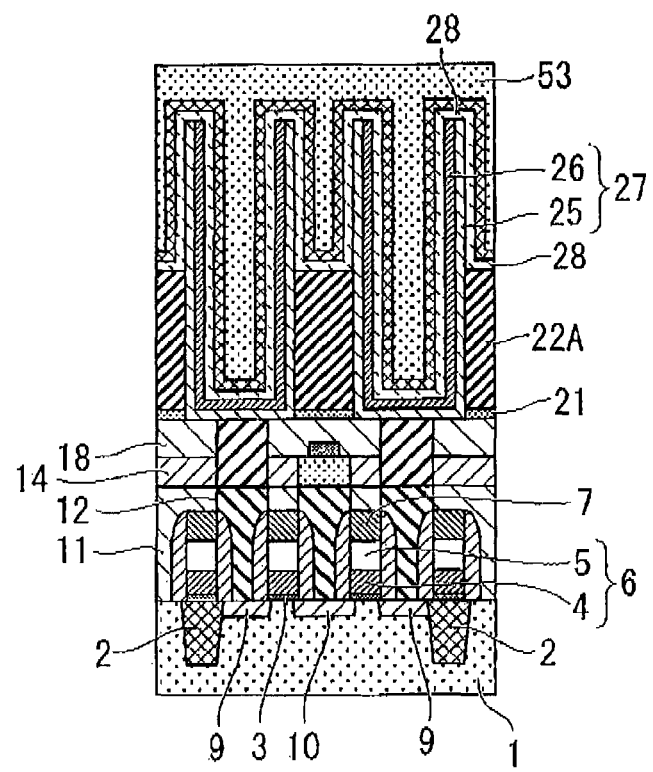
FIG. 7 is a cross-sectional view showing the semiconductor memory device according to the second embodiment of the present invention.

FIGS. 6 and 7 illustrate a semiconductor memory device according to a second embodiment of the present invention. In the second embodiment, the same structure and manufacturing method as the semiconductor memory device according to the first embodiment described earlier with reference to FIGS. 1 to 5 will be omitted.

The semiconductor memory device of the second embodiment is different from that of the first embodiment, in a structure of the capacitor part (the structure of the cylinder part) formed on the third interlayer insulating film 18.

As shown in FIG. 7, in the semiconductor memory device of the second embodiment, a silicon oxide film 22A is formed with a height, which is half of the height of the silicon oxide film 22 (see FIG. 5) of the first embodiment, on the third interlayer insulating film 18 through the nitride film 21. The lower electrode 27, which is formed in the inner side of the silicon oxide film 22A and includes the third silicon film 25 and the lower metal electrode 26, has the same structure as in the first embodiment. A capacitive insulating film 51 and an upper electrode 52 are laminated to cover the inner side of the lower metal electrode 26, the outer side of the third silicon film 25, and the top part 22B of the silicon oxide film 22A, which is adjacent to the outer side of the third silicon film 25. Then, a capacitive plate 53 is laminated to cover the capacitive insulating film 51 and the upper electrode 52, thereby forming a cylinder part.

The cylinder structure shown in FIG. 6 can be attained, by manufacturing the semiconductor memory device up to the sectional structure shown in FIG. 5, as described in the first embodiment, and then removing a portion of the silicon oxide film 22 using wet etching. The lower metal electrode 26 may be protected by a resist film or the like in the wet etching.

In the semiconductor memory device having the cylinder structure shown in FIG. 7, since the silicon oxide film 22A is about half the height of the deep hole cylinder part of the first embodiment, a cylinder structure up to the silicon oxide film 22A is an MIM structure and a portion above the top surface 22B of the silicon oxide film 22A has an MIS structure. With such a structure, it is possible to make the capacitance about 1.2 to 1.3 times as high as that in the first embodiment.

Figure 8:
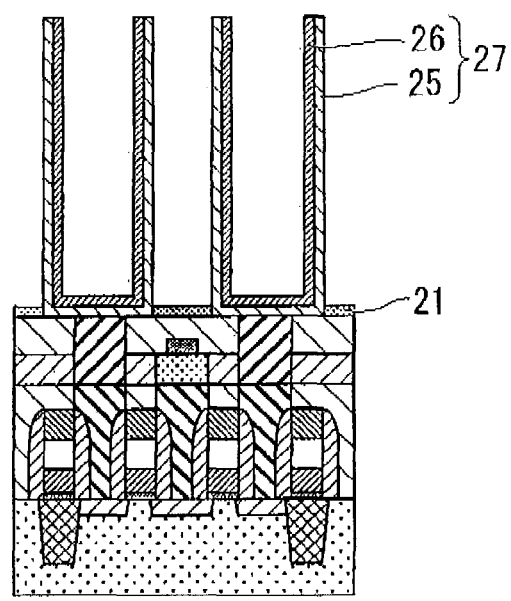
FIG. 8 is a cross-sectional view illustrating a semiconductor memory device manufacturing method according to a third embodiment of the present invention, showing a state in which a lower metal electrode and a third silicon film are formed and machined after a deep hole cylinder is machined.
Figure 9:
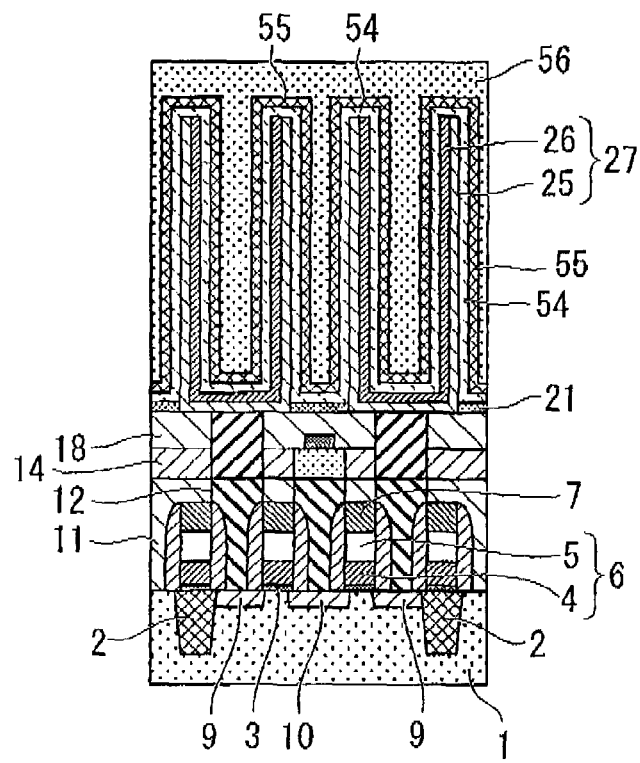
FIG. 9 is a cross-sectional view showing the semiconductor memory device according to the third embodiment of the present invention.

FIGS. 8 and 9 illustrate a semiconductor memory device according to a third embodiment of the present invention. In the third embodiment, the same structure and manufacturing method as the semiconductor memory device according to the first embodiment described earlier with reference to FIGS. 1 to 5 will be omitted.

The semiconductor memory device of the third embodiment is different from that of the first embodiment, in a structure of the capacitor part (structure of the cylinder part) formed on the third interlayer insulating film 18.

As shown in FIG. 9, in the semiconductor memory device of the third embodiment, the silicon oxide film 22 formed on the third interlayer insulating film 18 in the first embodiment is omitted. A capacitive insulating film 54 and an upper electrode 55 are formed to cover the lower electrode 27 composed of the third silicon film 25 and the lower metal electrode 26, and then, a capacitive plate 56 is laminated to cover the capacitive insulating film 54 and the upper electrode 55, thereby forming the capacitor part.

The cylinder structure shown in FIG. 8 can be attained, by manufacturing the semiconductor memory device up to the sectional structure shown in FIG. 5, as described in the first embodiment, and then removing all of the silicon oxide film 22 using wet etching. The third silicon film 25 and the lower metal electrode 26 may be protected by a resist film or the like in the above described wet etching. After removing all of the silicon oxide film 22, the third silicon film 25, the lower metal electrode 26 and the capacitive plate 56 may be formed.

The semiconductor memory device of the third embodiment having the cylinder structure without the silicon oxide film 22 provided in the first embodiment can be said to have an inner wall-MIM and outer wall-MIS structure. With such a structure, it is possible to increase the capacitance by about 1.5 to 1.6 times of that in the first embodiment.

FIGS. 10 to 13 illustrate a semiconductor memory device according to a fourth embodiment of the present invention. In the fourth embodiment, the same structure and manufacturing method as the semiconductor memory device according to the first embodiment described earlier with reference to FIGS. 1 to 5 will be omitted.

The semiconductor memory device of the fourth embodiment is different from that of the first embodiment, in a structure of the capacitor part (structure of the cylinder part) formed on the third interlayer insulating film 18.

Figure 13:
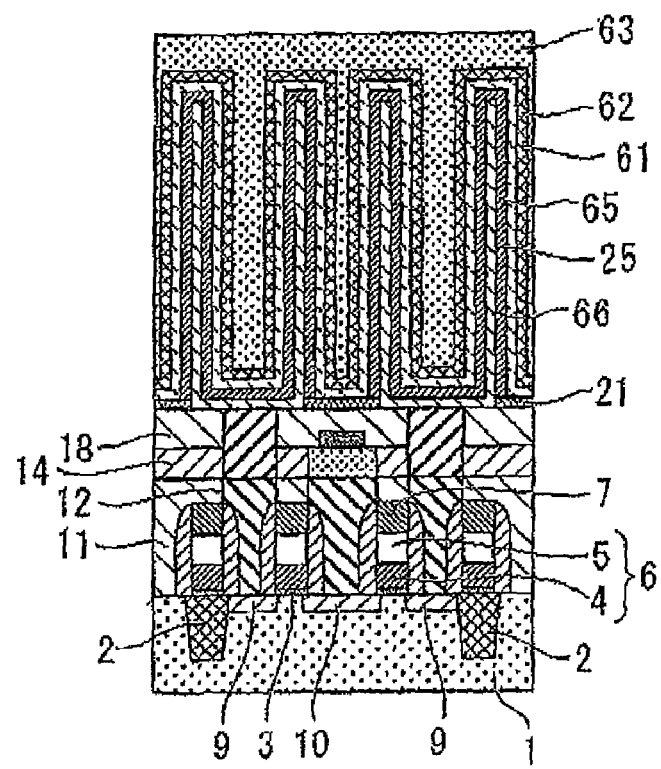
FIG. 13 is a cross-sectional view showing a semiconductor memory device according to a fourth embodiment of the present invention.
Figure 14:
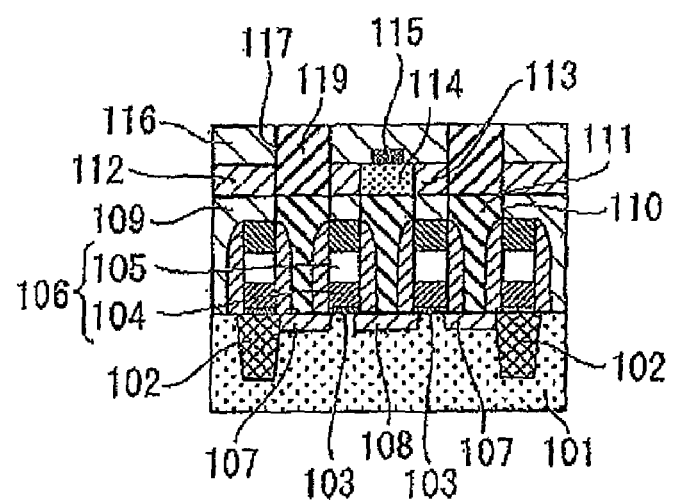
FIG. 14 is a cross-sectional view illustrating a conventional semiconductor memory device manufacturing method in the processing order, showing a state in which a cell contact plug and a capacitive plug are formed in addition to a transistor structure including source, drain and gate electrodes.
Figure 15:
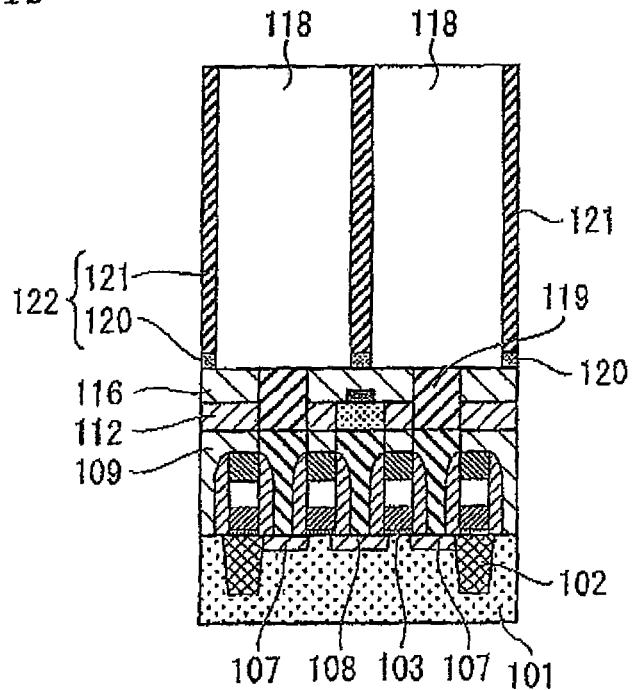
FIG. 15 is a cross-sectional view illustrating a conventional semiconductor memory device manufacturing method in the processing order, showing a state in which a capacitor deep hole cylinder is formed on an interlayer insulating film.
Figure 16:
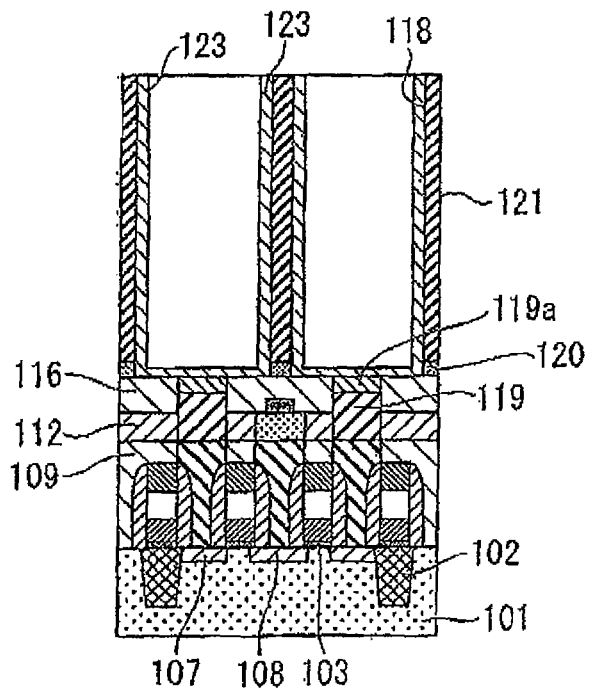
FIG. 16 is a cross-sectional view illustrating a conventional semiconductor memory device manufacturing method in the processing order, showing a state in which a lower electrode is formed in a deep hole cylinder.
Figure 17:
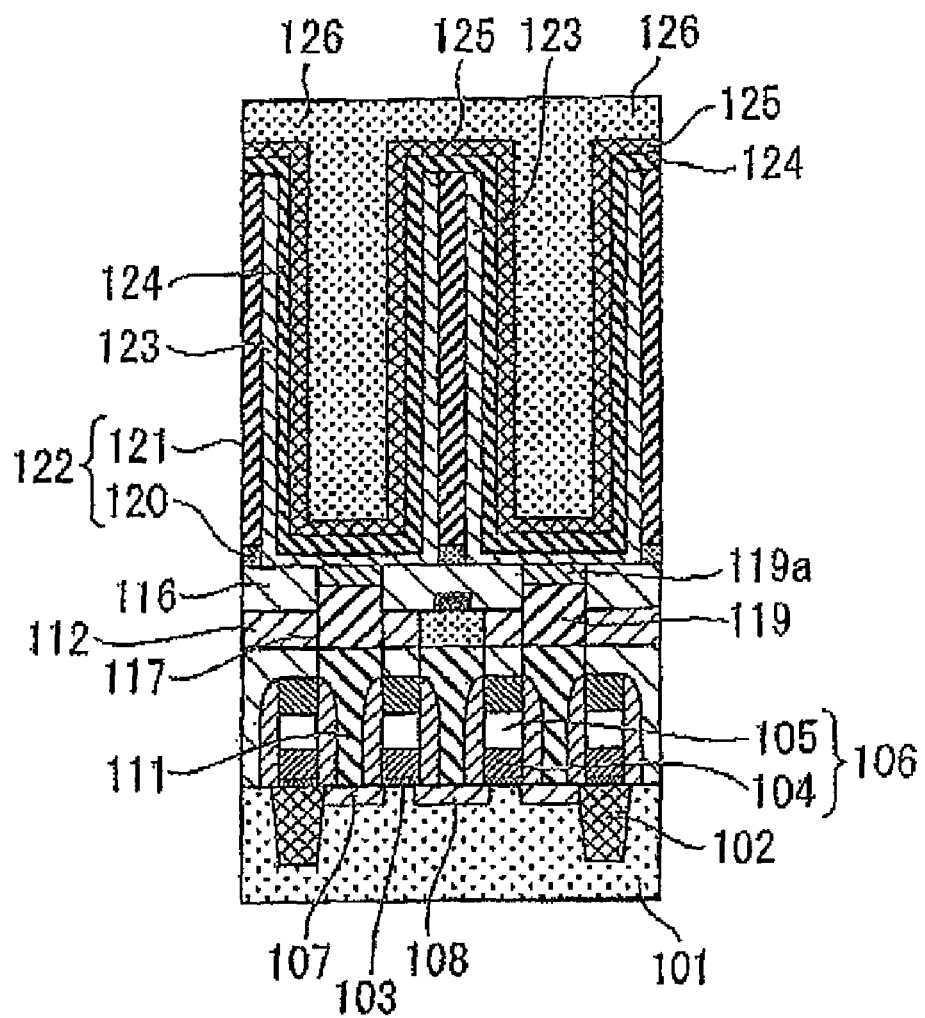
FIG. 17 is a cross-sectional view illustrating a conventional semiconductor memory device manufacturing method in the processing order, showing a state in which a capacitive insulating film, an upper electrode and a capacitive plate are formed in a deep hole cylinder.

As shown in FIG. 13, in the semiconductor memory device of the fourth embodiment, the silicon oxide film 22 and the lower metal electrode 26 formed on the third interlayer insulating film 18 in the first embodiment are omitted. A silicide film 60, a capacitive insulating film 61 and an upper electrode 62 are formed to cover the third silicon film 25, and then, a capacitive plate 63 is laminated to cover the silicide film 60, the capacitive insulating film 61 and the upper electrode 62, thereby forming the capacitor part.

Figure 10:
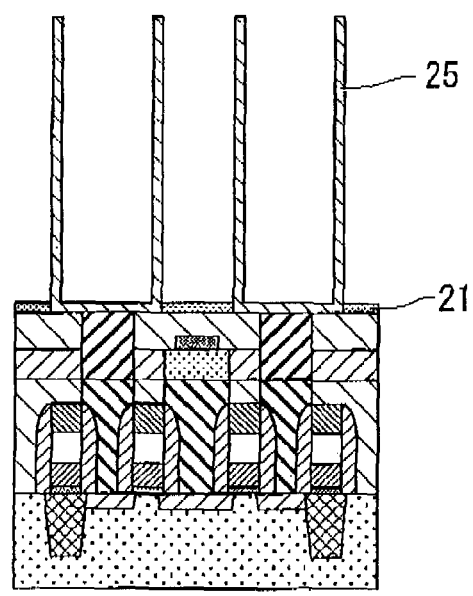
FIG. 10 is a cross-sectional view illustrating a semiconductor memory device manufacturing method according to a fourth embodiment of the present invention, showing a state in which a third silicon film is formed and machined after a deep hole cylinder is machined.
Figure 11:
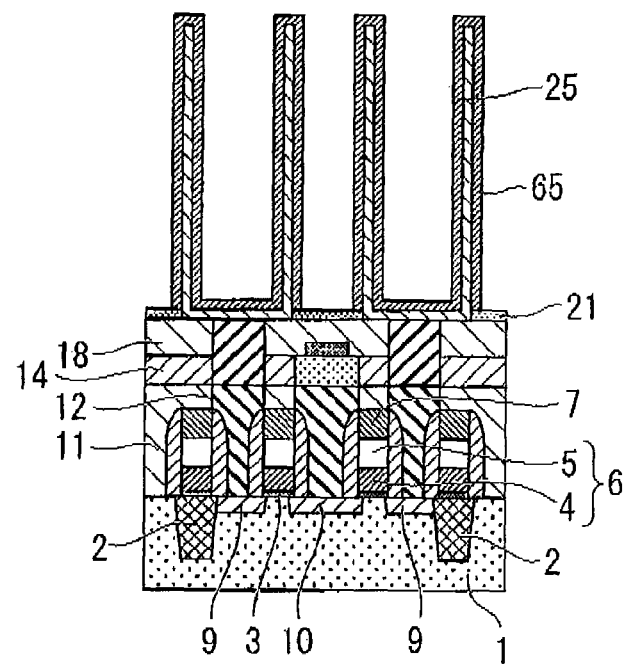
FIG. 11 is a cross-sectional view illustrating the semiconductor memory device manufacturing method according to the fourth embodiment of the present invention, showing a state in which a third silicon film is formed and machined after a deep hole cylinder is machined, and then tungsten is selectively grown.
Figure 12:
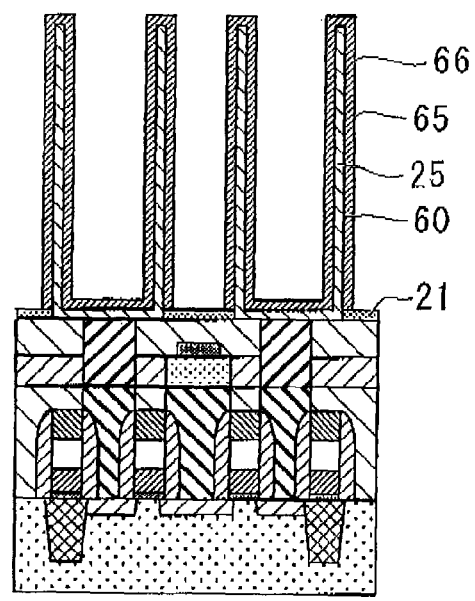
FIG. 12 is a cross-sectional view showing a silicided state of the state shown in FIG. 11.

In order to attain the cylinder structure shown in FIG. 13, the structure shown in FIG. 10 may be attained when manufacturing the semiconductor memory device up to the sectional structure shown in FIG. 5, as described in the first embodiment, and then removing all of the silicon oxide film 22 and the lower metal electrode 26 using wet etching. The third silicon film 25 may be protected by a resist film or the like in the wet etching. After removing all of the silicon oxide film 22 and the lower metal electrode 26, a metal silicide underlying layer 65 containing tungsten or the like is formed by selective growth to cover the third silicon film 25, and then, an interface between the third silicon film 25 and the metal silicide underlying layer 65 is silicided to form a silicide layer 66. Thereafter, the capacitive insulating film 61, the upper metal electrode 62 and the capacitive plate 63 may be formed.

The semiconductor memory device of the fourth embodiment having the cylinder structure including the silicide layer 66 and the upper electrode 62 without all of the silicon oxide film 22 and the lower metal electrode 26 provided in the first embodiment can be named as an inner-wall-MIM and outer-wall-MIM structure. With such a structure, it is possible to make capacitance about twice as high as that in the first embodiment.

An example of application of the present invention may include a semiconductor memory device having a capacitor stacked on a semiconductor substrate, in the form of a cylinder, which is called a stacked capacitor, for use in, for example, a dynamic random access memory (DRAM).

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A semiconductor memory device comprising:
   a semiconductor substrate;
   a transistor that is formed on the semiconductor substrate and has a source electrode;
   an interlayer insulating film that is formed over the semiconductor substrate;
   a contact plug that extends through the interlayer insulating film in a thickness direction and is electrically connected to the source electrode of the transistor, the contact plug being made of a first silicon film including first impurity atoms;
   an insulating film that is formed on the interlayer insulating film and has a cylinder hole; and
   a capacitor that comprises a second silicon film including the first impurity atoms, a Ti film on the second silicon film, a TiN film on the Ti film, a capacitive insulating film on the TiN film and an upper electrode on the capacitive insulating film, the second silicon film being disposed so as to cover a bottom and side surfaces of the cylinder hole,
   wherein the cylinder hole penetrates through the insulating film so as to expose an upper surface of the contact plug; and
   the second silicon film has a Ti silicide layer around an interface between the second silicon film and the Ti film, the Ti silicide layer being produced by a reaction of the second silicon film with the Ti film.

2. The semiconductor memory device according to claim 1, wherein each of the first and second silicon films is a polycrystalline silicon film including the first impurity atoms.

3. The semiconductor memory device according to claim 1, further comprising:
   a cell contact plug made of a third silicon film including the first impurity atoms, the cell contact plug being disposed between the source electrode of the transistor and the contact plug.

4. The semiconductor memory device according to claim 1, wherein the first impurity atom is phosphorous.

5. A method of manufacturing a semiconductor memory device, comprising:
   forming an interlayer insulating film over a semiconductor substrate on which a transistor is formed;
   forming a contact plug by a first silicon film including first impurity atoms, the contact plug penetrating through the interlayer insulating film in a thickness direction and being electrically connected to a source electrode of the transistor;
   forming an insulating film on the interlayer insulating film;
   forming a cylinder hole in the insulating film, the cylinder hole penetrating through the insulating film and exposing an upper surface of the contact plug;
   forming a second silicon film including the first impurity atoms to cover a bottom and a side surface of the cylinder hole;
   forming a Ti film on the second silicon film;
   forming a TiN film on the Ti film; and
   producing a Ti silicide layer between the second silicon film and the Ti film by reaction of the second silicon film with the Ti film.

6. The method of manufacturing a semiconductor memory device according to claim 5,
   wherein, the Ti film is formed by a high temperature plasma CVD method and the TiN film is formed by a thermal CVD method.

7. The method of manufacturing a semiconductor memory device according to claim 5, wherein the Ti film is formed at a room temperature of 650° C. or above.

8. The method of manufacturing a semiconductor memory device according to claim 5, further comprising:
   forming a capacitive insulating film on the TiN film after producing the Ti silicide layer; and
   forming an upper electrode on the capacitive insulating film.

9. The method of manufacturing a semiconductor memory device according to claim 8, wherein the upper electrode is made of a TiN film.

10. The method of manufacturing a semiconductor memory device according to claim 9, further comprising:
    forming a capacitive plate made of a W film on the upper electrode.

* * * * *